US008868154B2

(12) United States Patent
Levin et al.

(10) Patent No.: US 8,868,154 B2
(45) Date of Patent: Oct. 21, 2014

(54) OPTICALLY COUPLED READOUT FRONT-END FOR IMAGING SYSTEM

(75) Inventors: Craig S. Levin, Palo Alto, CA (US); Peter D. Olcott, Stanford, CA (US)

(73) Assignee: The Board of Trustees of The Leland Stanford Junior University, Stanford, CA (US)

(*) Notice: Subject to any disclaimer, the term of this patent is extended or adjusted under 35 U.S.C. 154(b) by 583 days.

(21) Appl. No.: 12/246,326

(22) Filed: Oct. 6, 2008

(65) Prior Publication Data
US 2009/0093710 A1 Apr. 9, 2009

Related U.S. Application Data

(60) Provisional application No. 60/997,950, filed on Oct. 4, 2007.

(51) Int. Cl.
A61B 5/05 (2006.01)
G01R 33/48 (2006.01)

(52) U.S. Cl.
CPC .................................. G01R 33/481 (2013.01)
USPC .. 600/411; 250/363.04; 250/368; 250/370.11

(58) Field of Classification Search
USPC ........ 600/407, 411, 476; 378/64; 250/363.03, 250/363.04
See application file for complete search history.

(56) References Cited

U.S. PATENT DOCUMENTS

| 4,939,464 A * | 7/1990 | Hammer ........................ 324/318 |
| 6,946,841 B2 | 9/2005 | Rubashov | |
| 2002/0168317 A1* | 11/2002 | Daighighian et al. ....... 424/1.11 |
| 2004/0195512 A1* | 10/2004 | Crosetto .................. 250/363.04 |
| 2005/0230626 A1* | 10/2005 | Crosetto ........................ 250/367 |
| 2006/0058683 A1* | 3/2006 | Chance .......................... 600/476 |
| 2007/0102641 A1* | 5/2007 | Schmand et al. ......... 250/363.03 |
| 2007/0228283 A1* | 10/2007 | Graumann et al. ....... 250/363.05 |

OTHER PUBLICATIONS

Albuquerque, E., et al., "The Clear-PEM Electronics System," Nuclear Science, IEEE Transactions on , vol. 53, No. 5, pp. 2704-2711, Oct. 2006.
Anghinolfi, F., et al. "NINO: An ultrafast low-power front-end amplifier discriminator for the time-of-flight detector in the ALICE experiment," IEEE Trans. Nucl. Sci. 51, 1974 (2004).
Catana, C., et al., "Simultaneous acquisition of multislice PET and MR images: initial results with a MR-compatible PET scanner," J Nucl Med. Dec. 2006;47(12):1968:76.
Fries, M.D., et al., "High-precision TDC in an FPGA using a 192 MHz quadrature clock," Nuclear Science Symposium Conference Record, 2002 IEEE, vol. 1, No., pp. 580-584, vol. 1, Nov. 10-16, 2002.
Kephart, R., et al., "E-537 MWPC amplifier", FNAL; ERA-10-009019; EDB-85-024438, 1979.

(Continued)

Primary Examiner — Unsu Jung
Assistant Examiner — Michael N Fisher
(74) Attorney, Agent, or Firm — Greer, Burns & Crain, Ltd.

(57) ABSTRACT

A front end for an imaging system. The front end comprises at least one magnetically-insensitive high-energy photon detector and an interface for converting an output of the at least one high-energy photon detector to an optical signal and transmitting the optical signal. A receiver is optically coupled to the interface to receive the optical signal and convert the optical signal into a voltage signal.

14 Claims, 13 Drawing Sheets

(56) References Cited

OTHER PUBLICATIONS

Kipnis, I., et al., "A time-over-threshold machine: the readout integrated circuit for the BABAR Silicon Vertex Tracker," Nuclear Science, IEEE Transactions on , vol. 44, No. 3, pp. 289-297, Jun. 1997.
Krieger, B., et al., "SVX4: a new deep-submicron readout IC for the Tevatron collider at Fermilab," Nuclear Science, IEEE Transactions on , vol. 51, No. 5, pp. 1968-1973, Oct. 2004.
Levin, C.S., et al., "Investigation of position sensitive avalanche photodiodes for a new high-resolution PET detector design," Nuclear Science, IEEE Transactions on , vol. 51, No. 3, pp. 805-810, Jun. 2004.
Manfredi, P. F., et al., "Noise limits in a front-end system based on time-over-threshold signal processing, Nuclear Instruments and Methods in Physics Research Section A: Accelerators, Spectrometers, Detectors and Associated Equipment," vol. 439, Issues 2-3, Jan. 11, 2000, pp. 361-367.
Meyer, T.C., et al., "A Time-Based Front End Readout System for PET & CT," Nuclear Science Symposium Conference Record, 2006. IEEE, vol. 4, No., pp. 2494-2498, Oct. 29, 2006-Nov. 1, 2006.
Olcott, P.D., et al. "Novel Electro-Optical Coupling Technique for Magnetic Resonance—Compatible Positron Emission Tomography Detectors", Molecular Imaging, vol. 8, No. 2, Mar.-Apr. 2009, pp. 74-86.
Olcott and Levin, "Pulse Width Modulation: a Novel Readout Scheme for High Energy Photon Detection".
Paneque et al., "Analogue Signal Transmission by an Optical Fiber System for the Camera of the MAGIC Telescope", 28th Intl. Cosmic Ray Conference, 2003, pp. 2927-2930.
Pichler, B.J., et al., "Performance test of an LSO-APD detector in a 7-T MRI scanner for simultaneous PET/MRI," J. Nucl Med. Apr. 2006;47(4):639-47.
Shimazoe, K., et al., "Novel front-end pulse processing scheme for PET system based on pulse width modulation and pulse train method," Nuclear Science Symposium Conference Record, 2007. NSS '07. IEEE, vol. 6, No., pp. 4612-4614, Oct. 26, 2007-Nov. 3, 2007.

\* cited by examiner

OPTICALLY COUPLED READOUT FRONT-END FOR IMAGING SYSTEM

PRIORITY CLAIM AND REFERENCE TO RELATED APPLICATION

This application claims the benefit of U.S. Provisional Application Ser. No. 60/997,950, filed Oct. 4, 2007, under 35 U.S.C. §119, which is incorporated by reference herein.

FIELD OF THE INVENTION

A field of the invention is imaging methods, apparatus, and systems.

BACKGROUND OF THE INVENTION

Positron emission tomography (PET) is a medical imaging modality that uses positron emitting radionuclides attached to specific molecules that are introduced into the body of an animal and tracked by an imaging system. This provides sensitive assays of a wide range of biological processes, e.g., processes related to cancer or other diseases associated with alterations in the functional metabolism of cells in the body. Tracking is possible because the radionuclides emit high-energy photons that are detected with high spectral and temporal resolution by imaging system detectors. A principal drawback of existing PET technology, however, is its relatively poor spatial resolution (e.g., 1-2 mm) making unambiguous localization of signals difficult in many cases.

On the other hand, alternative imaging modalities such as, but not limited to, magnetic resonance imaging (MRI) provide extremely detailed anatomical information with high spatial resolution, e.g., as good as 20 microns. Moreover, innovative techniques in methods such as MRI have led to a remarkable increase in the range of physiological information that can be obtained during an imaging session in addition to conventional structural MRI, and this information has further helped to improve diagnosis and treatment.

As nonlimiting examples, diffusion-weighted MRI (DWI) has become an established technique for the early diagnosis of acute stroke. Perfusion-weighted MRI (PWI) is an evolving MRI technology for studying cerebral hemodynamics and blood flow, with the creation of hemodynamic maps of cerebral blood flow (CBF), cerebral blood volume (CBV), and mean transit time (MTT) or time to bolus peak (TTP). As another example, functional MRI (fMRI) can image hemodynamic and metabolic changes that are associated with human brain functions, such as vision, motor skills, language, memory, and mental processes; it is in use for the localization of visual, motor, and somatosensory responses in surgery of tumors, as well as for elucidation of brain function and metabolism altered by pathologies such as stroke, multiple sclerosis, and Alzheimer's disease.

Along with the development of novel MRI techniques, a current trend is toward the use of higher magnetic fields (e.g., 3 T and higher), mainly driven by the expected gain in the signal-to-noise ratio (SNR) that roughly correlates with the field strength, and that may be used to obtain even higher spatial resolution and contrast, and to reduce MRI scanning time. Higher fields also give rise to several challenges (stronger susceptibility effects, increased physiological noise and RF power deposition, etc.), but they have been proven to facilitate study of brain biophysics and biochemistry (metabolic cycles, perfusion, neuronal architecture, etc.), and of other organ systems as well (breast, musculoskeletal, etc.). Although some cutting-edge material is still under development, and additional time might be required until this technology is commonly available, most of these methods can be applied on most state-of-the art MRI scanners.

Given the complementarity of the information provided by PET and methods such as MRI, as well as the level of performance that has been recently achieved by the two separate modalities, many expectations have arisen recently from the conceptual possibility to acquire simultaneous PET and MR images, and thus 1) obtain an immediate anatomical localization of the PET signal as well as 2) observe the simultaneous dynamic correlation between the functional behavior of tissues and their anatomy. Also, further discoveries and consequent improvements in clinical practice can originate from the integration of more advanced MR measurements, such as but not limited to dynamic contrast enhanced MR, diffusion-tensor imaging, functional MRI, MR spectroscopic imaging, neuronal tract tracing, cell trafficking, and paramagnetic contrast agents, with tracer kinetic experiments utilizing radio-labeled probes that are targeted to specific aspects of the biology of interest.

Despite these expectations, however, such combined PET and MRI scanners are not readily available in the art. As one reason, it is very challenging to build PET electronics that can fit compactly into the small bore of an MRI system, while at the same time not degrade in the presence of the extremely high static and dynamic fields of the MRI system. At the same time, it is easy for the PET detectors to inject noise into the extremely sensitive RF pickup of an MRI system. For example, there are several ways in which the two imaging modalities can interfere with each other, causing artifacts and degradation in image quality, including: the presence and the operation of the PET instrumentation inside or close to the MR imaging region perturb the homogeneity of the BO field and the linearity of the gradient fields in the MR system; radiofrequency interference may occur between the MR transmit/receive coils and the electronics of the PET system; and the placement of materials inside the static and switching magnetic fields of the MR magnet may lead to susceptibility artifacts, eddy currents, and other effects, which may compromise the operations of the PET+MRI system.

SUMMARY OF THE INVENTION

According to example embodiments of the present invention, a front end for an imaging system is provided. The front end comprises at least one magnetically-insensitive high-energy photon detector and an interface for converting an output of the at least one high-energy photon detector to an optical signal and transmitting the optical signal. A receiver may also be provided, which is optically coupled to the interface to receive the optical signal and convert the optical signal into a voltage signal.

DETAILED DESCRIPTION

Figure 1:
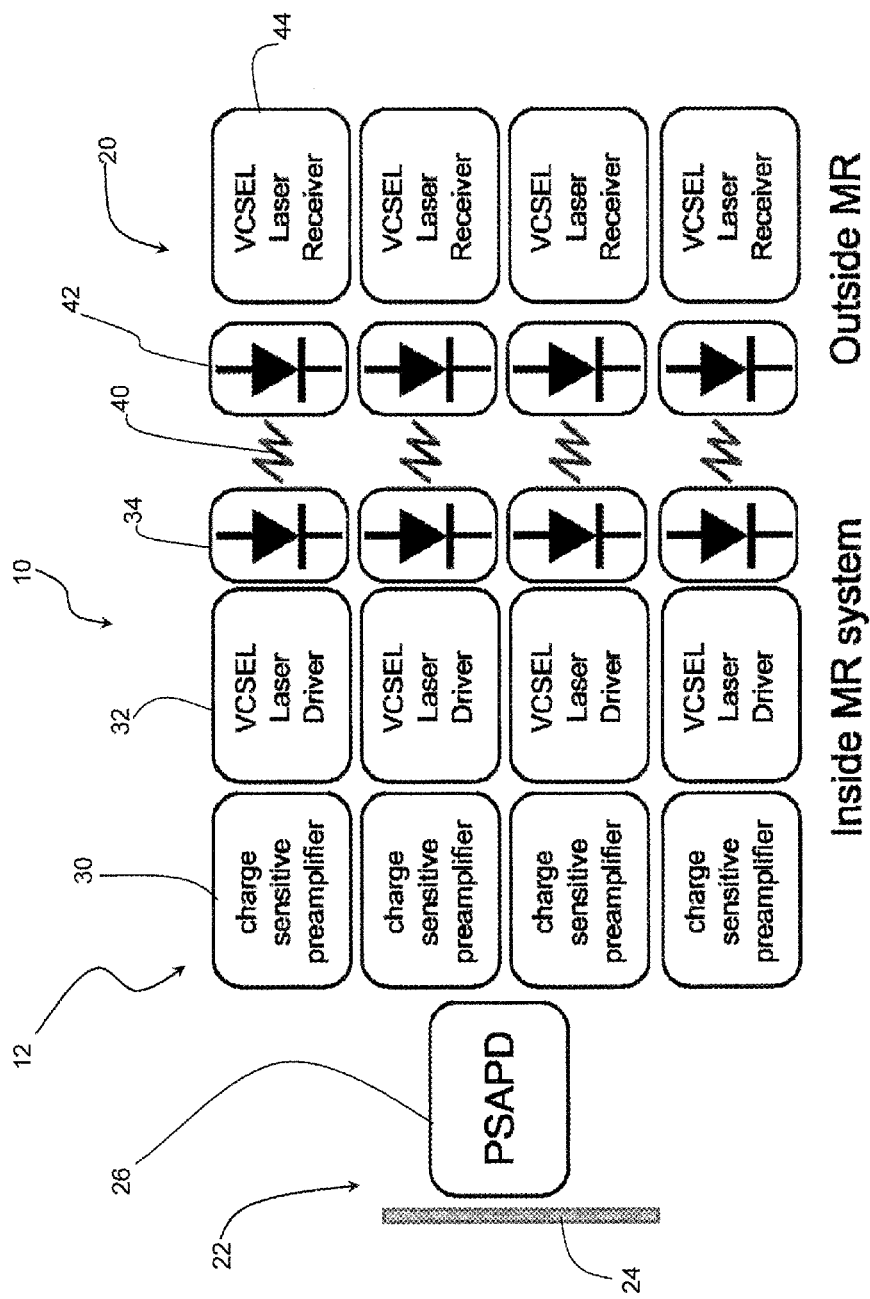
FIG. 1 shows an example front-end module, including a detector and a receiver, according to an embodiment of the present invention.

The possibility of integrating PET with other modalities, such as MRI, has become more accessible due to the progress made in the field of solid state detectors, such as but not limited to Avalanche Photodiodes (APDs), Position Sensitive Avalanche Photodiodes (PSAPDs), and Solid State Photomultipliers, which are much less sensitive to magnetic fields than the photomultipliers (PMTs) traditionally used in PET systems. Also, radiofrequency shielding materials that are transparent to the main static magnetic field and low-frequency switching gradient magnetic fields, such as but not limited to thin copper sheets, are now commercially available relatively inexpensively and can isolate the sensitive PET detector from electromagnetic interference from the MRI.

Generally, two methods have been used to integrate PET detectors inside an MRI system. One method electronically couples a PET detector insert using wires and processing electronics, which can cause mutual electronic interference with MRI/MRS system electronics. Another method uses a long optical fiber light guide to bring optical signals from a scintillation crystal directly from the scintillation crystal out to photodetectors that reside in either a low field region or outside the MR system.

Many efforts have been made toward the development of optical devices and techniques to be used for optical data transmission. Optical data transmission provides a way to design and physically locate the photodetectors used for the readout of scintillation light and/or the electronics of the PET system outside a magnetically sensitive region, such as the MR imaging region, and to isolate them from the high switching and static magnetic fields characteristic of the latter modality. To be effective, the isolation should be realized by using appropriate shielding and by interrupting any electrical connection between these parts of the system and the electronic instrumentation that might take place inside the magnetically sensitive region (e.g., MR imaging region).

A previously-developed MR-compatible PET system prototype was based on a ring of lutetium oxyorthosilicate (LSO) crystals coupled via optical fibers to PMTs. Simultaneous in vivo imaging with spin echo MRI and fluorodeoxyglucose (FDG) PET in a rat were performed with this system. Serious compromises in PET performance were demonstrated, however, owing to the restricted sensitivity of this system, limited by the light attenuation into the fibers and the constraints in their number (in order to accommodate their large volume into the magnet bore).

A similar system has been disclosed that employs APDs for the readout of optical fibers coupled to LSO crystals. Again, preliminary results showed that short optical fibers (20 cm long) are needed to avoid significant attenuation of the weak scintillation light during its path into the fibers. Mechanical polishing of the crystals is also required to limit the loss of signal due to the non-optimal optical coupling between the crystals and the fibers.

Further, an APD/LSO PET insert for existing magnets has been recently developed. Again, the major limitations to this apparatus are related to the constraints in the length of the fiber (to avoid attenuation of the light) and the challenging task of coupling the optical fibers to the LSO crystals.

To be useful for a wide range of clinical protocols a whole body PET/MR system preferably has a large (e.g., >20 cm) axial field of view (FOV) PET insert, without affecting the MR data. To instrument a large axial FOV ring PET requires the relaying of many (e.g., thousands of) high speed electronic channels from MR compatible PET detectors from within the magnet to an external data acquisition system. In addition, the PET system should not influence the gradient and RF elements of an MR system, and vice versa.

Example embodiments of the present invention provide, among other things, a PET system including a detector and readout assembly that can operate in a high magnetic field environment, e.g., a high field MRI system, with insignificant degradation in either PET system performance or MRI system performance. An example embodiment employs a low power simple analog front-end detector module (e.g., circuit) including a magnetically-insensitive interface that transmits the high energy photon information sensed by a high energy photon detector, such as a semiconductor sensor, over one or more optical fibers outside of a high magnetic field to a region that has a low magnetic field. A magnetically insensitive device is one that does not contain any ferrous or strongly paramagnetic metals, alloys, or compounds. Ferrous metals are comprised of iron, nickel, or cobalt elementally, or when contained in alloys with other metals. These materials have a high magnetic susceptibility greater than $$1000 \frac{\chi_m}{10^{-6} \text{cm}^3 \cdot \text{mol}^{-1}},$$

and will distort the uniformity of the >1 T magnetic field needed by MRI which in turn will degrade image performance. By optical conversion of the detector signals and subsequent transmission through fiber, one can provide a large field-of-view PET detector gantry inside an MRI system for clinical imaging, with uncompromised PET and MR performance. Also, by optical coupling after signal amplification and generation of a robust laser pulse, degradation from optical coupling is reduced.

An example front-end detector module includes components for performing signal processing steps. These components include at least one magnetically-insensitive high energy photon detector, such as but not limited to a semiconductor-based high energy photon detector, a preamplifier/ amplifier/logic circuit, a diode (e.g., a laser diode), and an optical coupler for optically coupling the module to a receiver (e.g., a fiber optic coupler). If a high energy photon detector has significant signal (e.g., current gain greater than 100 thousand), as may be supplied, by nonlimiting example, by a solid state photomultiplier tube (SSPM), it can be coupled to the optical coupler without a preamplifier. A nonlimiting example of such a coupling includes coupling using a capacitor. The optical output signal from this example detector module is detected and processed, preferably well outside the MR system, with a receiver, for example a photodetector and data acquisition system, such as but not limited to a standard photodetector and data acquisition system.

The front-end detector module and receiver together provide a front-end for various PET systems. The example PET module can be used with a conventional PET system if desired, with the preamplifier/amplifier/logic circuit, laser diode, and fiber optics replacing electrical wires in the conventional PET system. This can significantly reduce the number of electrical wires needed (e.g., from hundreds or thousands to as few as three). Additionally, the photon detector signals can travel over separate paths from the electrical wires. Electrical and magnetic isolation preferably is provided between the PET system and the MR system.

Preferred embodiments will now be discussed with respect to the drawings. The drawings include schematic figures that are not to scale, which will be fully understood by skilled artisans with reference to the accompanying description. Features may be exaggerated for purposes of illustration. From the preferred embodiments, artisans will recognize additional features and broader aspects of the invention.

FIGS. 1-4 show an example setup 10 for integrating a PET system into an imaging system of a different modality that employs a high magnetic field. According to an example embodiment of the present invention, a front-end PET detector module 12 resides within a high magnetic field environment, for example, a high magnetic field environment of an MRI, such as but not limited to inside an MR imaging bore. As a nonlimiting example, the imaging bore strength may be 10,000 Gauss or greater.

Figure 2:
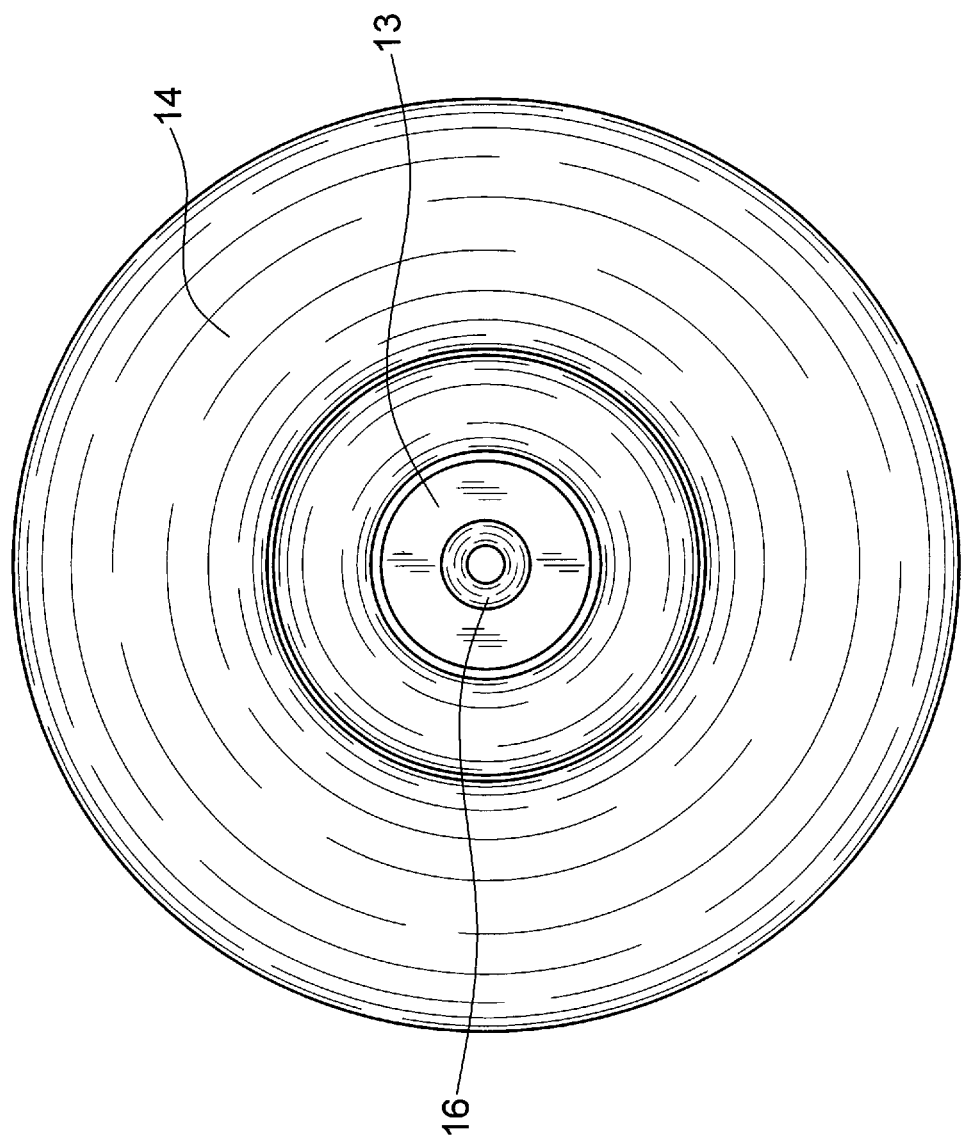
FIG. 2 shows an example MR bore with a shielded PET insert and an RF coil with foam thermal insulation inside the shielded PET/MR electronics insert, according to an embodiment of the present invention.
Figure 3:
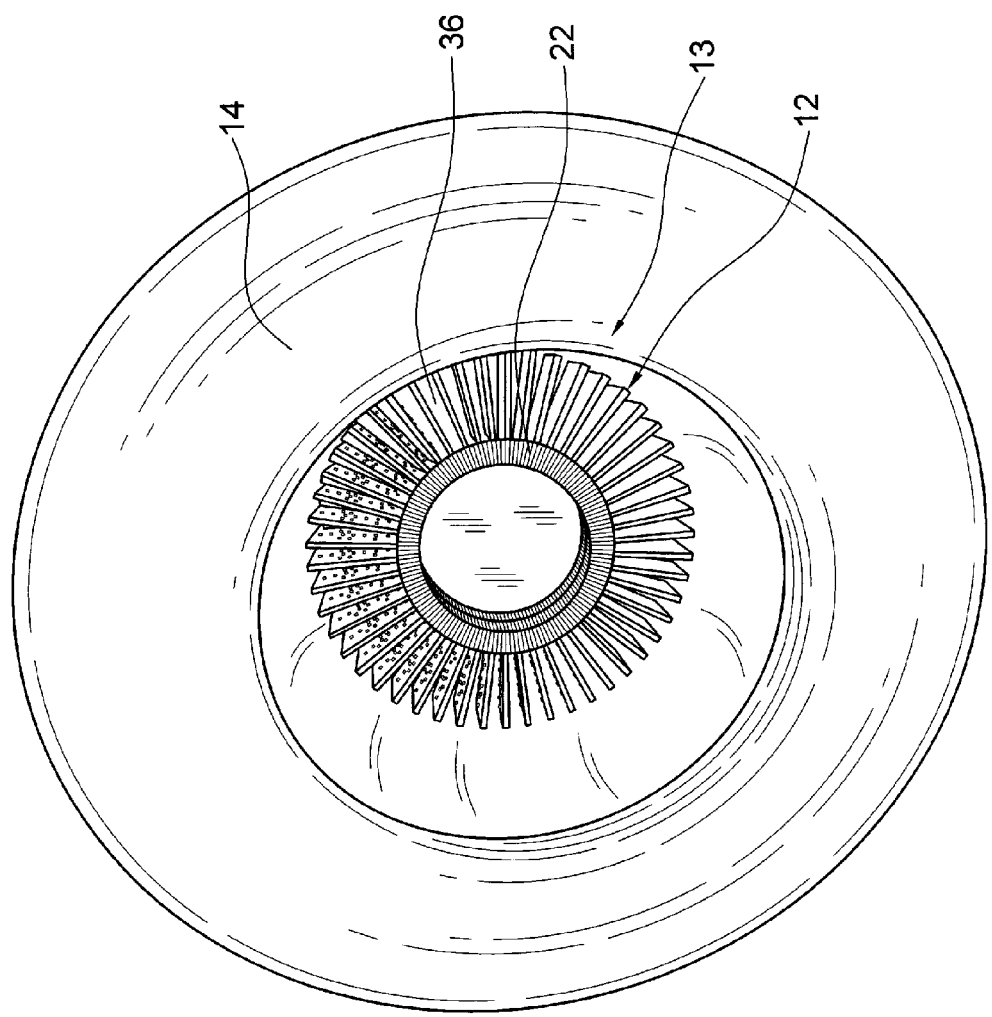
FIG. 3 shows example electronics for the PET insert of FIG. 2, including a plurality of PET detectors, according to an embodiment of the present invention.

As a nonlimiting example, multiple individual front-end PET detector modules 12 can be used to provide a ring-shaped PET insert disposed in a high-magnetic field environment. FIGS. 2-3 show an example PET insert 13 inside an MR imaging bore 14, which as a nonlimiting example includes a Magnex 310 bore diameter magnet, with an outer dimension of 135 cm, an inner dimension of 31 cm, and a gradient of 16 cm. The PET insert 13 is substantially surrounded by a shield, as best shown in FIG. 2. In a preferred embodiment, the PET insert 13 is shielded using a thin copper conductor arranged as a Faraday shield connected to ground. An RF coil 16 for use with the MR imaging bore 14 is disposed within the center of the PET insert 13.

The MRI magnet 14 may be modified to place the PET front-end 13 within the magnet. For example, RF coils of the MRI may be placed inside the ring formed by the PET insert 13. In a nonlimiting example, an RF coil 18 includes foam thermal insulation, and has an outer diameter of 6 cm and an inner diameter of 3 cm. Operation of the MR imaging bore will be understood by those of ordinary skill in the art.

A receiver 20 is located in a region outside the high magnetic field, e.g., outside the MR system. Outside the high magnetic field, the magnetic field environment has a significantly lower field strength, as a nonlimiting example, 100 Gauss or lower. This location may be, as one example, greater than 2 meters from the MR imaging bore 14, but may also be a low field region in the MR system (such as with a split bore magnet).

The example front-end PET detector module 12 includes a magnetically-insensitive high energy photon detector 22 that is positioned to detect photons from a source of emitted photons and produce a charge that is not significantly changed by a magnetic field. The high energy photon detector 22 may be, as nonlimiting examples, one or more scintillation crystals 24 coupled to one or more semiconductor photodetectors (e.g., APD) 26, one or more direct interaction semiconductors, or magnetically-insensitive photodetectors including photomultiplier tubes.

Figure 4:
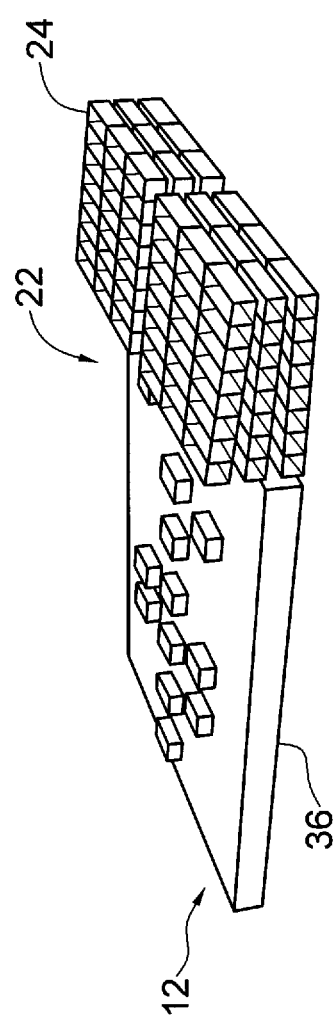
FIG. 4 shows an individual PET detector, according to an embodiment of the present invention.

A nonlimiting example PET detector module 12 is based on the optically coupled readout front-end of a Position Sensitive Avalanche Photodiode (PSAPD) 26. The PSAPD 26 is preferably directly coupled to an array of the scintillation crystals 24, as best shown in FIGS. 3-4. In a nonlimiting example embodiment, the scintillation crystals 24 each include a 2.4 cm axial FOV, 1 cm deep LSO 8×8×1 mm crystal.

APDs are magnetically insensitive, and thus are particularly suitable for operation in a high-field magnetic environment. However, the high-energy photon detector 22 may use other methods. An alternative high-energy photon detector is a direct interaction semiconductor, such as Cadmium Zinc Telluride (CZT), which is also magnetically insensitive and produces a charge signal that is proportional to the incoming energy of the photons. In the case of a direct interaction semiconductor, the photodiode 26 may not be necessary. Those of ordinary skill in the art will appreciate that various sources of emitted photons and high energy photon detectors are possible, and the present invention is not to be limited to a particular configuration for either the source of emitted photons or the high energy photon detector.

In a nonlimiting example embodiment, the high energy photon detector 22 is suitably coupled to a low power, analog preamplifier 30, which converts a charge to a voltage. The output of the preamplifier 30 is connected to a circuit that converts a voltage signal to a current, which in turn is used to produce light. This current preferably is insensitive to temperature and environmental effects. In an example embodiment, the preamplifier output is connected to a driver circuit 32 that converts the signal into a form that is optimal for driving a laser diode 34, such as but not limited to a Vertical Cavity Surface Emitting Laser (VCSEL) laser diode. Alternatively, a standard laser diode, other fiber optic laser diode, LED, or generally any solid state, magnetically insensitive device that converts current to light, may be used. In other example embodiments, if the high energy photon detector 22 has a very large gain, it can be directly coupled to the VCSEL laser diode without using a preamplifier.

VCSELs 34, when operated in analogue mode by simple and fast-driving electronics, can translate the electrical signals from the PSAPDs 26 into optical signals. As will be appreciated by those of ordinary skill in the art, a VCSEL is a laser diode that emits light perpendicular to its surface, rather than from its side, which allows it to produce a low-divergent, circular beam, allowing a high coupling efficiency into optical fibers. VCSELs have a very low capacitance and high modulation speed (e.g., up to 4 GHz). Further, they have a low lasing current threshold (e.g. ~3 mA) compared to other types of lasers, which makes them easy to drive and reduces the power consumption. Additionally, VCSELs are relatively inexpensive devices. They can be manufactured in arrays by IC fabrication, a characteristic that may represent a significant advantage if arrays of solid state detectors are used together with these devices.

The form or modulation of the signal that is optimal for VCSEL laser diodes can be, for example, any amplitude or pulse-width modulation technique. In an example embodiment, amplitude modulation includes the conversion of the charge into a linear current signal, and conversion of the current signal into light; i.e., linear current modulation into light. However, it will be appreciated that different modulation methods besides linear amplitude or pulse-width modulation may be used. The preamplifier 30, driver 32, laser diode 34 may be provided (with other components as needed or desired) on a circuit board 36, as shown in FIGS. 3 and 4. Particularly, in example embodiments, a small printed circuit board (PCB) may be provided as part of the front-end detector module 12 to hold electronic components, as will be appreciated by those of ordinary skill in the art, for scintillation detection, charge sensitive preamplification, laser driving, and for converting current to light.

An example preamplifier 30 is a charge sensitive preamplifier. A preferred charge sensitive preamplifier 30 is a fully differential preamplifier that prevents interference from an MRI environment. Because the preferred preamplifier 30 is a differential amplifier, it can prevent pickup from MRI interference from the gradient or RF-coil 16, and prevent the driver circuits from interfering with the MRI. Alternatively, a single-ended preamplifier could be used and converted to a differential amplifier, though it is preferred to use a differential preamplifier and differential laser driver. As another alternative, direct connection can be used between the high energy photon detector and the laser. Direct connection can be done, as a nonlimiting example, by a single passive device such as a capacitor.

The front-end detector module 12 thus allows the amplification of the signals from the photodiode 26 and their optical transmission, for example, to the receiver 20, which may, but need not, be a commercially available data acquisition system. Again, it is preferred that the receiver 20 be located outside an MR imaging region. In a particular example embodiment, the laser diode 34 converts the analog electronic signal into an optical signal 40. This signal 40 is then relayed over a light coupling device, such as an optical fiber, to an acquisition system, such as the receiver 20. An example receiver 20 includes a receiving detector, such as a photodiode 42 and a laser receiver preamplifier 44, for receiving the optical signal 40 and converting the signal to a current and/or voltage for use in PET processing, as known to those of ordinary skill in the art. In a nonlimiting example receiving method, photodiodes allow a receiving detector to provide a current, which is converted by a preamplifier into a voltage. This voltage can be read by standard PET electronics (preferably positioned outside the MRI, at a point away from magnetic interference (e.g., at least 2 m)).

In an example embodiment, the optical signals are transformed back into electric pulses by P-I-N diodes 42 in the receiver 20, after traveling through the fibers. Analogous signal transmission systems based on VCSELs and optical fibers have been used in different applications, such as the development of the MAGIC telescope, as provided in D. Paneque, H. J. Gebauer, E. Lorenz, M. Martinez, R. Mirzoyan, and T. S. Tran, "Analogue Signal Transmission by an Optical Fiber System for the Camera of the MAGIC Telescope", 28$^{th}$ International Cosmic Ray Conference, 2003, pp. 2927-2930, which is incorporated in its entirety herein by reference.

Optically coupling the output of photodetectors 26 using laser diodes 34 provides robust signal amplification without degrading signal-to-noise ratio. For example, if the PET insert 13 is to operate inside a high-field MR system, the signal 40 can be relayed outside of the high-field MR system to a low-field area. The optical signal 40 thus can be read out using the receiver 20 as provided by a suitable electronic system, such as but not limited to standard electronic systems, accordingly providing high performance with minimal interference effect, such as mutual effect of the PET and MR electronics.

For the high-energy photon detector 22 including the scintillation crystal(s) 24 (e.g., LSO crystals) and photodetector 26, coupling the optical fibers to the VCSELs, and not directly to the scintillation crystals, leads to several advantages. For example, the use of the preamplifiers 30 and VCSELs 34 in the example PSAPD readout front-end 12 will allow alleviation of the constraints on the length of the fibers that can be used without significant degradation of the signal 40; fibers of up to several meters can be used (as a nonlimiting example), instead of lower required lengths (e.g., 20 cm), though it may be desirable to reduce or minimize fiber lengths for other considerations, such as cost. Additionally, the task to optimize the coupling to reduce signal losses is made easier by both the (excellent) beam properties of the VCSELs 34 and the lack of necessity to perform delicate operations on the surface of the crystals 24.

Further, the number of optical fibers can now be made proportional to the number of PSAPDs 26, versus the number of LSO crystals 24 in an array (which is usually larger) as in some previous systems. The same sensitive area can thus be provided using a smaller volume for the cable containing all the optical fibers. For example, the PET detector module 12 may include six arrays of 64 LSO crystals 24, with four readout channels each, and six PSAPDs 26, providing 24 readout channels.

Figure 5:
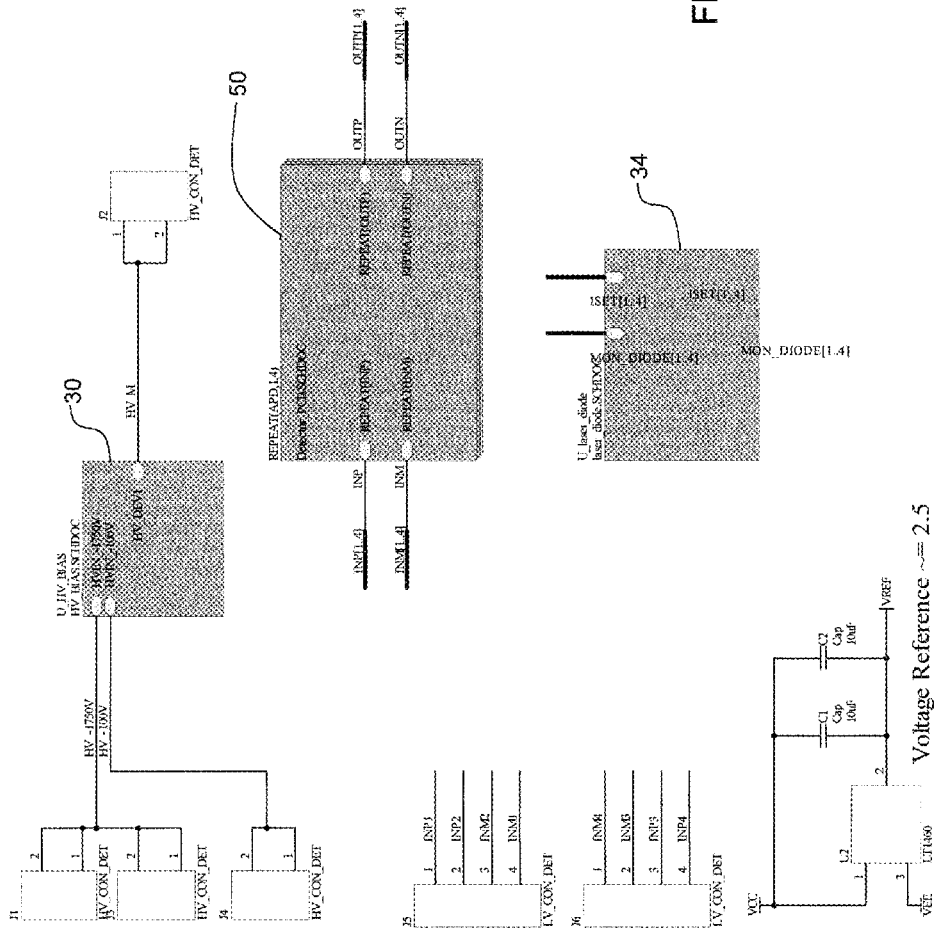
FIG. 5 is a circuit diagram of an example electronics setup with a four-channel optical PET/MR system, according to an embodiment of the present invention.

FIG. 5 shows particular example electronics for a four-channel optical PET front end detector module 12, including an interface 50 for the PSAPD 26, the preamplifier 30, the laser driver 32, and the laser diode 34. Additionally, FIG. 6 shows features of the example PSAPD interface 50 in this arrangement, and FIG. 7 shows features of the example APD preamplifier 30 and laser driver 32.

Figure 6:
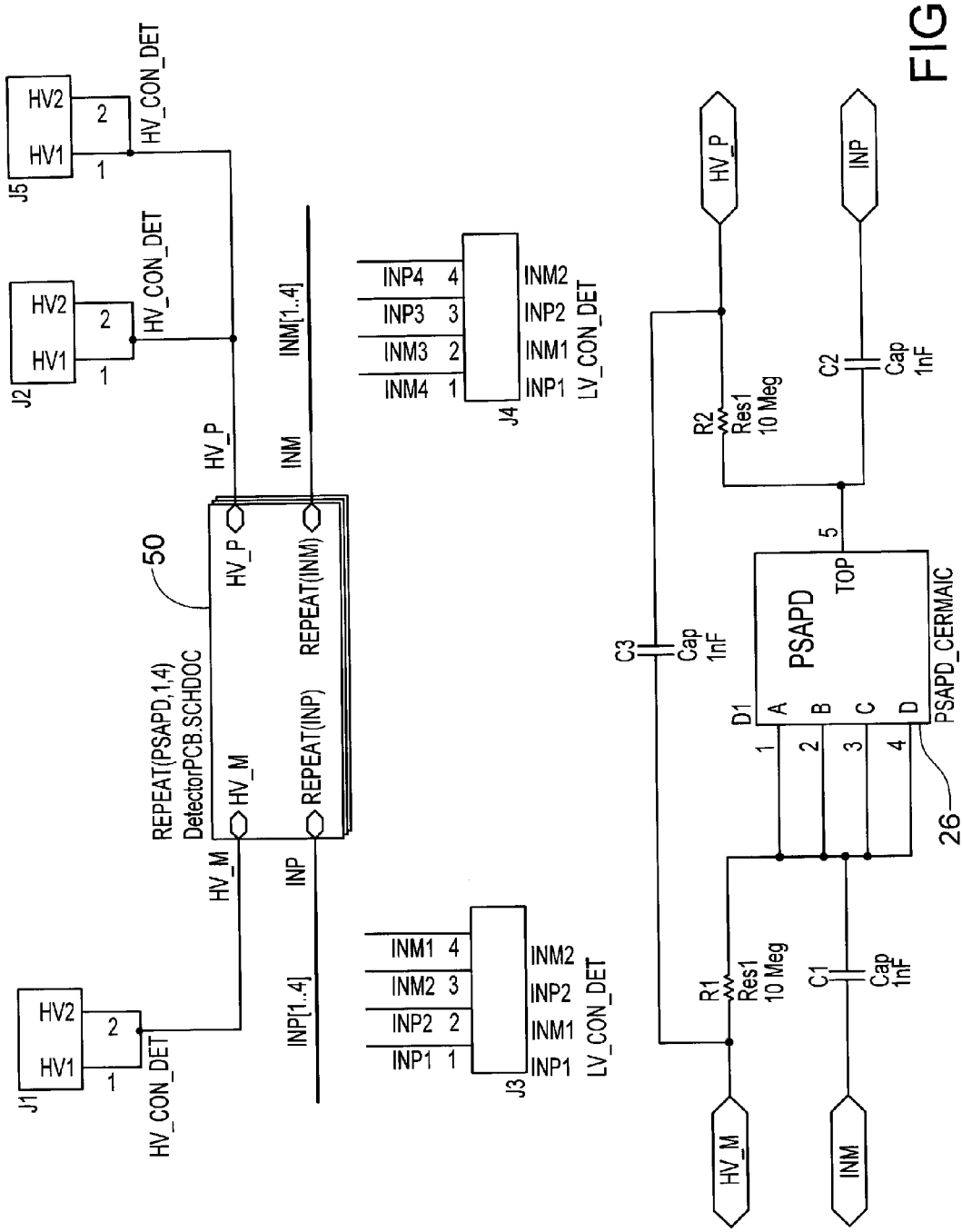
FIG. 6 is a circuit diagram of an example interface for a Position Sensitive Avalanche Photodiode (PSAPD) according to an embodiment of the present invention.
Figure 7:
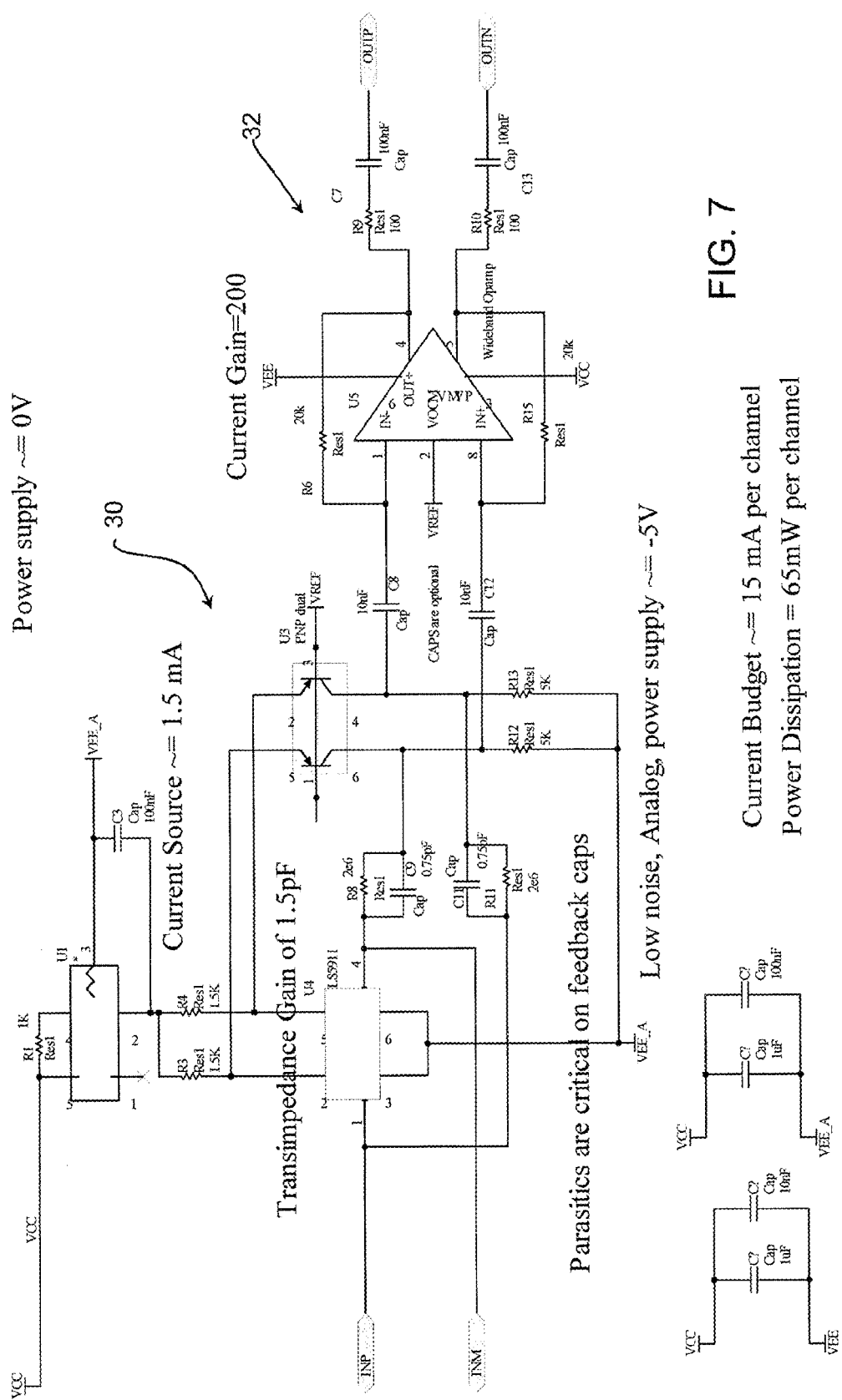
FIG. 7 is a circuit diagram of an example Avalanche Photodiode (APD) preamplifier and laser driver arrangement in a front-end module, according to an embodiment of the present invention.

FIG. 6 shows the differential AC coupling of the analog signal from the APD device with a high voltage connection. The example PSAPD device requires approximately −1750 V across the terminals to produce a current gain of 1000. In response to scintillation light, a differential current will flow across the capacitors to the output terminals. FIG. 7 shows a fully differential JFET charge sensitive preamplifier and laser driver. The differential current from the APD is converted into a voltage and then driven into a fully differential amplifier. This amplifier then converts the voltage into a fully differential current to drive a VCSEL laser. In an ANGER scintillation block detector, there are four APD detectors, four preamplifiers, four laser drivers, and four lasers. The particular components shown will be understood by those of ordinary skill in the art, a more detailed explanation of these components is omitted for clarity.

To achieve the complete isolation of the detector head (e.g., the PET insert 13) and associated front end detector module 12 from the electronics that will be placed outside the MR imaging region (e.g., outside MR imaging bore 14), isolated power supplies are preferred. Conventional methods of powering electronic devices in high magnetic fields using copper wire have inherent limitations, including the potential for conductive grounding effects, electromagnetic interference, crosstalk between cables, and RF heating.

More recent methods of powering electronic devices have been implemented with photonic power over non-conductive fiber to eliminate these problems. Photonic power creates electrical power by illuminating a photovoltaic power converter (PPC) with laser light delivered over fiber. Power over isolated, non-conductive cable has proven to be capable of driving electronics without being affected by high magnetic and RF fields, and low-voltage (LV) power supplies based on these techniques are commercially available. High-voltage optical power supplies are not yet commercially available, and thus a different isolation power supply architecture may be used to provide the necessary bias to the PSAPDs. It is to be noted, however, that the present invention is not to be limited to a particular power supply method or apparatus, as one of ordinary skill in the art can employ any of various power supplies based on the particular need and/or constraints, e.g., operating environment.

In an example assembly method, the PET detector front-end is installed by placing the PET insert 13 inside of an MR system. As described above, the PET detector front-end and the receiver 20 may interface with a PET system as will be appreciated by those of ordinary skill in the art. Example PET and MR systems are described in Pichler B J, Judenhofer M S, Catana C, Walton J H, Kneilling M, Nutt R E, Siegel S B, Claussen C D, and Cherry S R, "Performance test of an LSO-APD detector in a 7-T MRI scanner for simultaneous PET/MRI", J Nucl Med. 2006 April; 47(4): 639-47; and Catana C, Wu Y, Judenhofer M S, Qi J, Pichler B J, Cherry S R, "Simultaneous acquisition of multislice PET and MR images: initial results with a MR-compatible PET scanner", J Nucl Med. 2006 December; 47(12): 1968-76. These two documents are incorporated in their entirety by reference herein.

Figure 8:
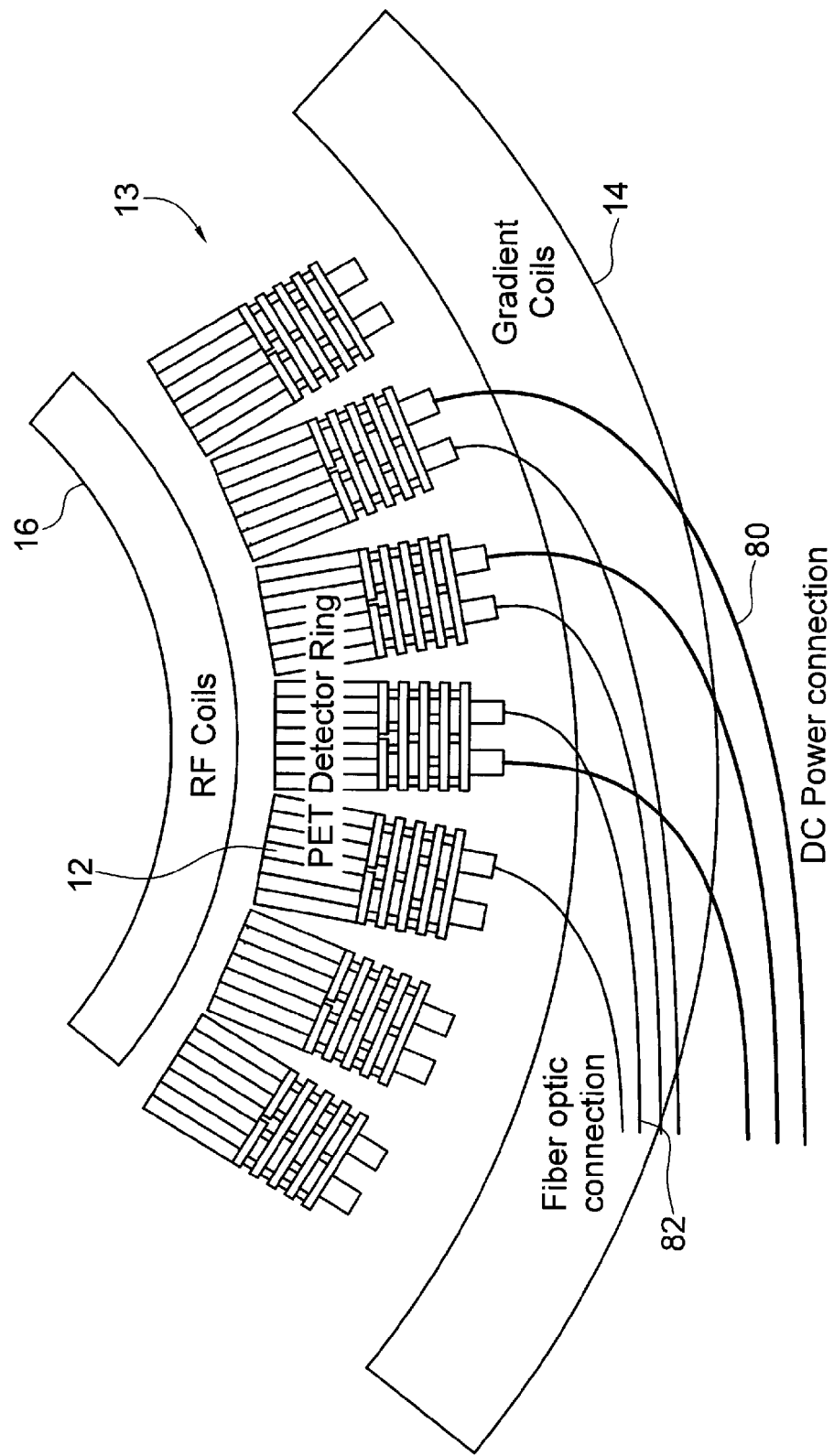
FIG. 8 shows an optical coupling for PET detectors in a detector ring, according to an embodiment of the present invention.

Preferably, as shown for example in FIG. 8, these two components are very compactly inserted. Individual detector modules 22 may be arranged for a larger (wider) field of view. The RF coils 16 may be placed inside the PET detector ring insert 13, as also shown in FIG. 2. The MRI detection system otherwise (for example) may be configured and operated conventionally, as will be appreciated by those of ordinary skill in the art.

In this nonlimiting example embodiment, the PET detector ring insert 13 makes electrical contact outside the MR system with three electrical wires 80—high voltage bias, low voltage bias, and ground—all fixed signals. Preferably, these are the only electrical wires that go from outside the MR system to inside the MR system. Optical cables 82 couple the laser diodes 34 to the portion of the PET front-end module disposed outside the MR system, such as the receiver including, for example, the receiving detector 42 and preamp 44. The remainder of the PET electronics used for imaging may then be connected to the output of the PET module (that is, to the output of the receiver 20), and configured and operated as will be appreciated by one of ordinary skill in the art.

Accordingly, this example electro-optical readout system for a PET scintillation block detector relays signals using optical fibers 82 rather than shielded coaxial signals, while preserving high SNR of the PET signals. The VCSEL laser diodes 34 relay the electrical pulses from the APD detectors 24 without degrading SNR. The electro-optical coupling further provides that the only electrical connections to the PET ring 13 are DC power signals that are shared among many PET detector elements. RF anti-resonant isolation can be integrated into the power connections, and this allows the PET ring 13 to be high impedance with respect to the RF coils 16 to reduce loading on them within the MR system.

Figure 9:
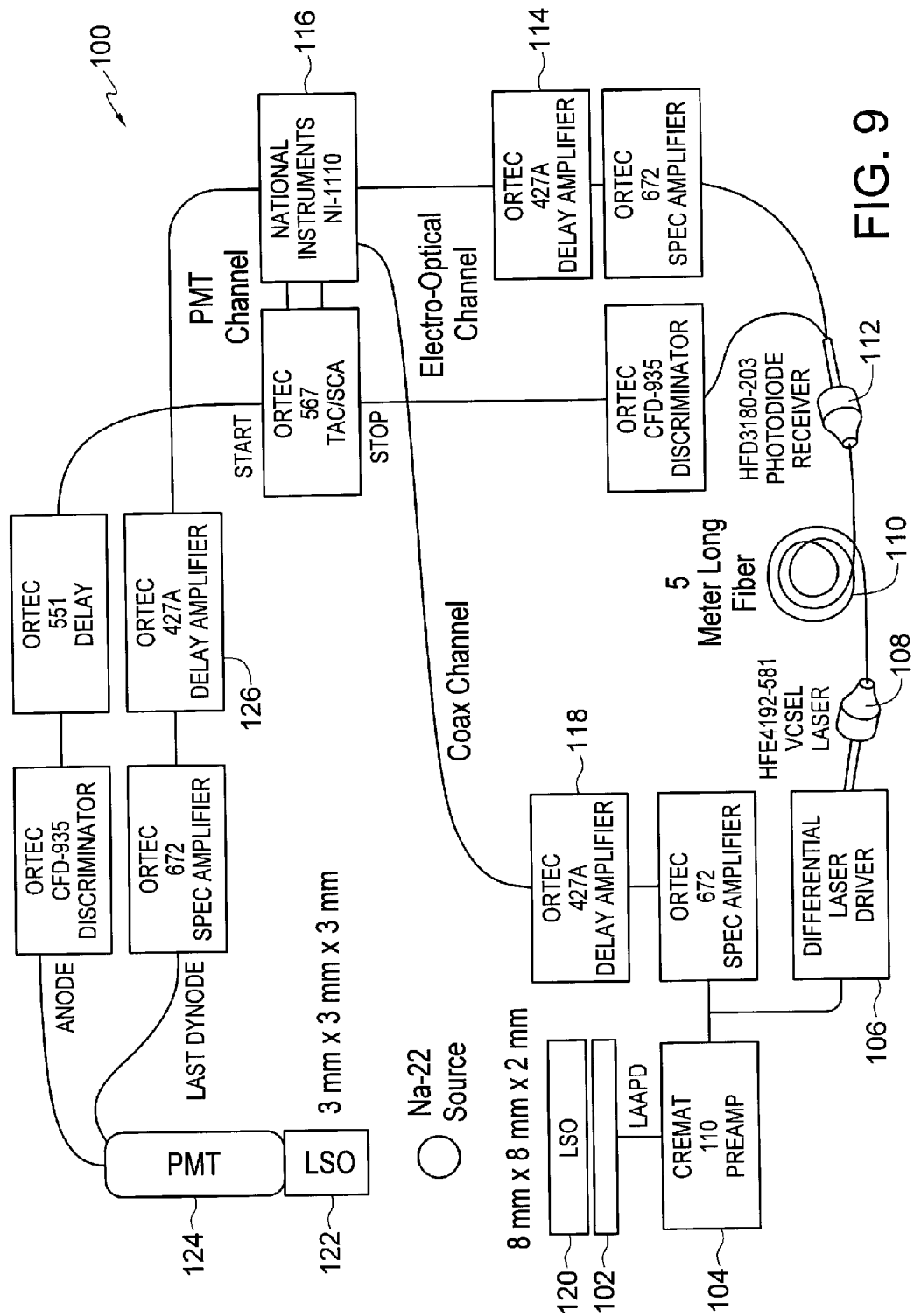
FIG. 9 shows an experimental setup for measuring energy spectra and coincidence timing performance without and with VCSEL electro-optical coupling.

FIG. 9 shows an experimental NIM-based electronics spectroscopy setup 100 used to evaluate the performance of an electro-optical coupling, such as the example electro-optical coupling shown in FIG. 8. This spectroscopy setup was used to measure energy spectra and coincidence timing performance both without and with VCSEL electro-optical coupling. In this nonlimiting example setup 100, an 8 mm×8 mm large area, high gain APD (LAAPD) 102, such as that disclosed in K. S. Shah, R. Farrell, R. Grazioso, E. S. Harmon, and E. Karplus, "Position-sensitive avalanche photodiodes for gamma-ray imaging", Nuclear Science, IEEE Transactions on, vol. 49, no. 4, pp. 1687-1692, August 2002, is connected to a Cremat preamplifier 104, and the analog output is used to drive a VCSEL laser 106. The VCSEL laser 106 is biased with a 7 mA forward current to operate with DC optical output via a laser driver 108, and the preamplifier signal is coupled over two 400 ohm resistors differentially into the VCSEL laser. A 5 meter single mode optical fiber 110 is used to relay the optical signal to a receiver photodiode 112. A high speed trans-impedance amplifier 114 converts the photodiode signals into electrical signals, which are sent to a measuring device 116.

Further, the spectroscopy setup used an 8 mm×8 mm×2 mm LSO crystal 120 coupled to the LAAPD device 102 in coincidence with a 3 mm×3 mm×3 mm LSO crystal 122 connected to a 1 cm diameter PMT 124. The PMT was coupled to an amplifier 126, and the output was coupled to the measuring device 116. The linearity of the VCSEL electro-coupling was measured over the output dynamic range of the Cremat preamplifier (0-160 mV) 104 that was used to drive the laser 108.

Figure 10:
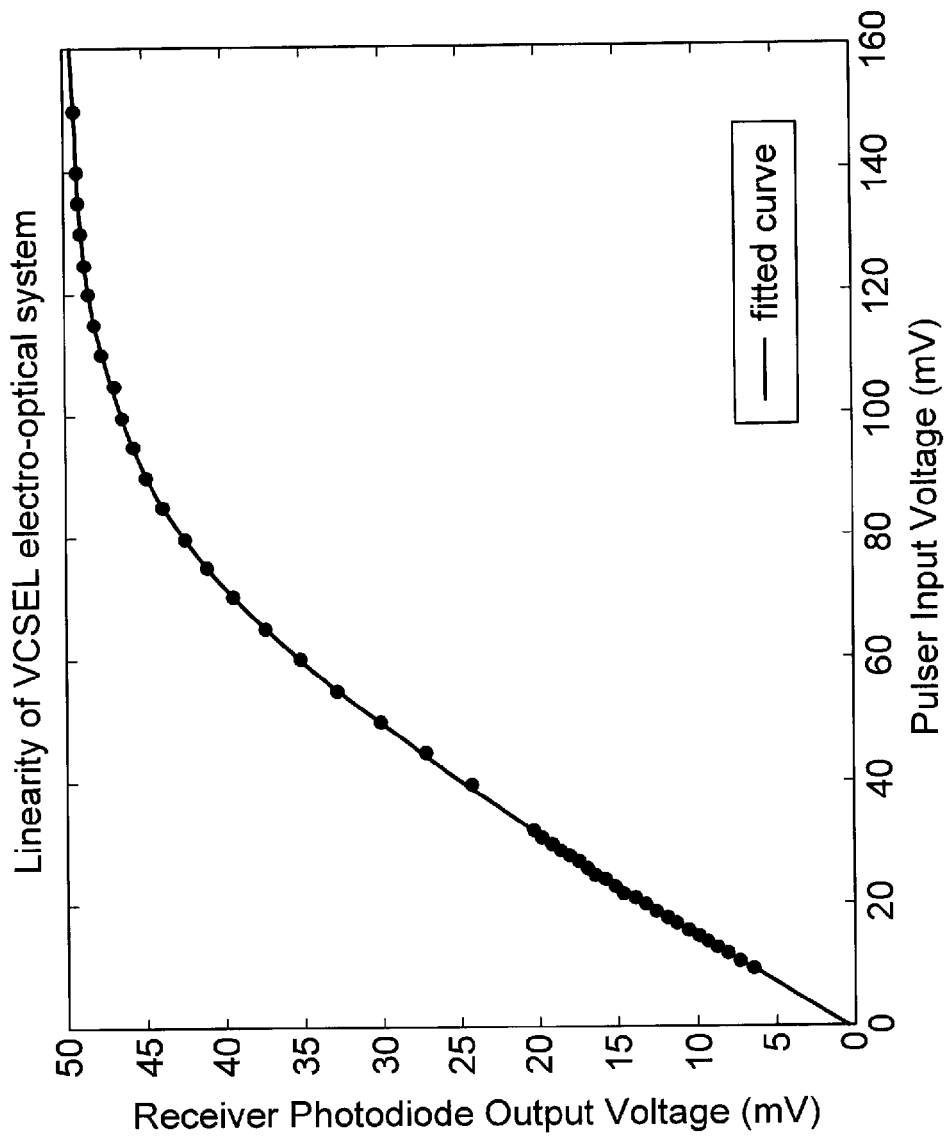
FIG. 10 shows pulser linearity measurements over an input dynamic range (0-100 mV) of the VCSEL laser diode driver and output photodiode receiver in FIG. 9.

The linearity of the VCSEL electro-optical coupling is determined by the non-linear input voltage to output current relationship for a forward biased receiver diode, as shown in FIG. 10. The non-linearity can be calibrated out since the transfer function is strongly monotonic and deterministic.

Figure 11A:
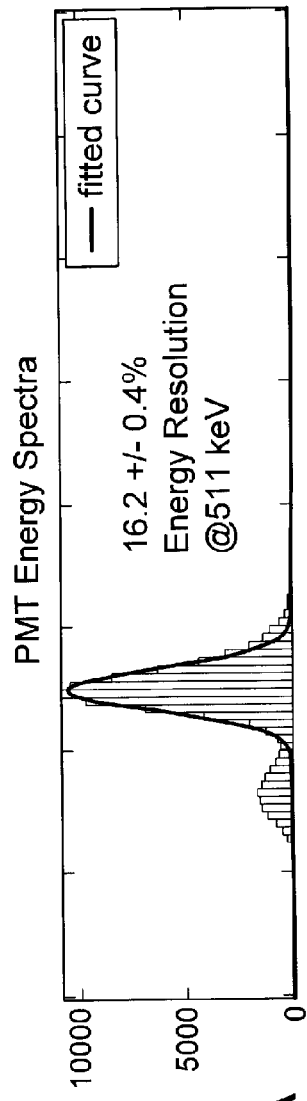
FIGS. 11A-11C show raw Na-22 flood energy spectrum of an 8 mm×8 mm×2 mm sheet crystal of LSO, in coincidence with a photomultiplier (PMT) (FIG. 11A), without (FIG. 11B), and with electro-optical coupling (FIG. 11C) at 1740 V.
Figure 11B:
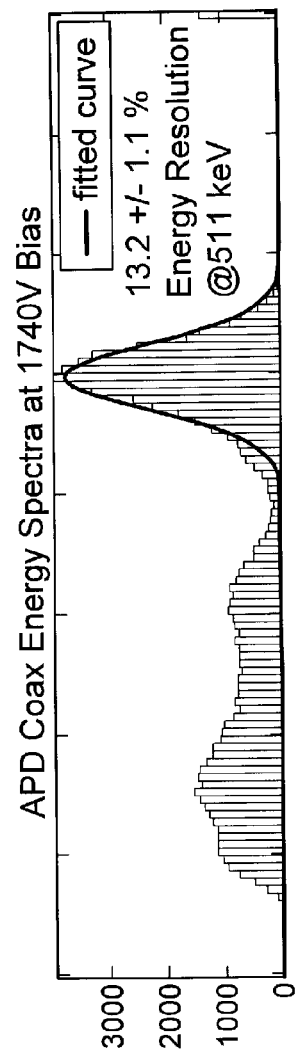
Figure 11C:
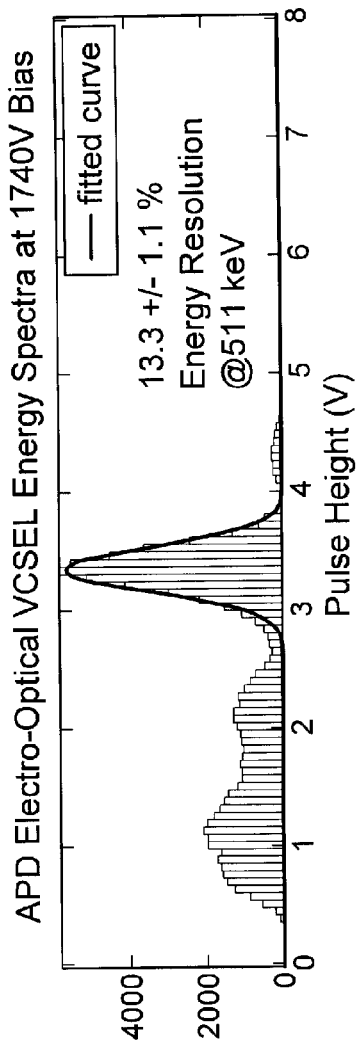

FIGS. 11A-11C show the coincidence energy spectra of the sheet crystal of LSO in coincidence with the PMT 24 (FIG. 11A), without (FIG. 11B), and with electro-coupling (FIG. 11C). The coincidence energy spectra showed no difference in the coincidence percentage energy resolution. However, care should be taken in interpreting energy resolution for a system with a non-linear response in the axis. A calibration source at several energies could be used to confirm the energy performance of the VCSEL optically coupled laser system.

Figure 12A:
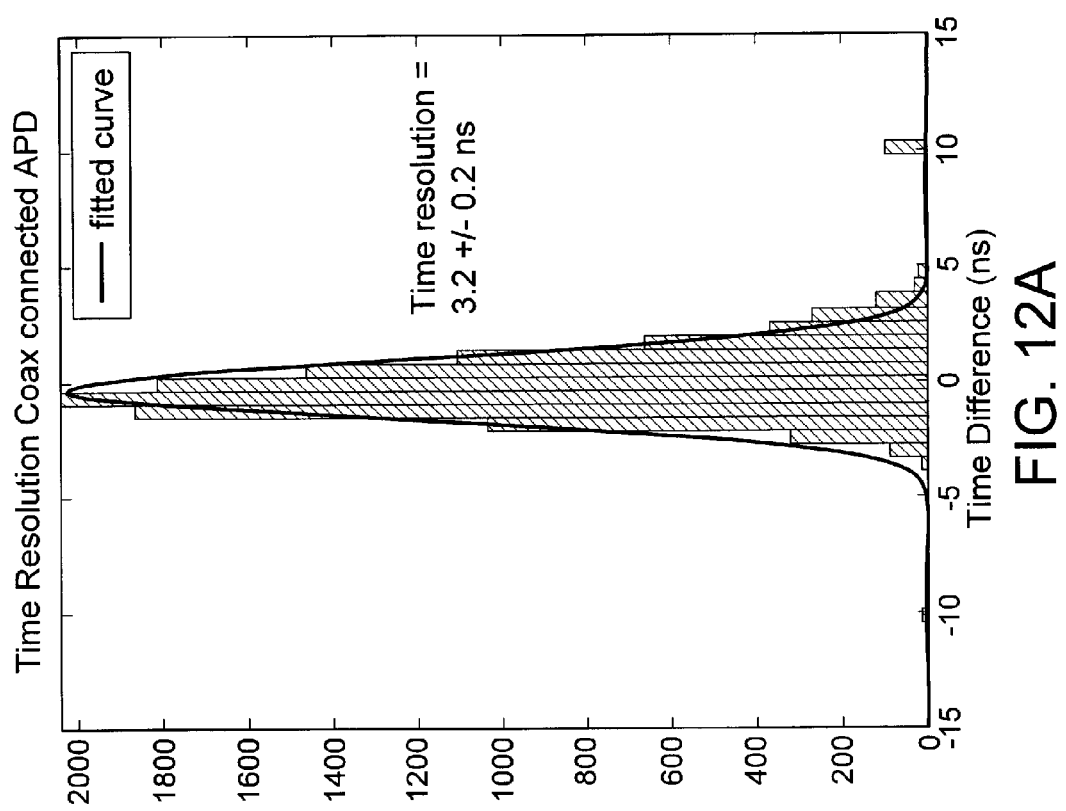
FIGS. 12A-12B show PMT-APD coincidence time spectrum before (FIG. 12A) and after electro-optical coupling (FIG. 12B).
Figure 12B:
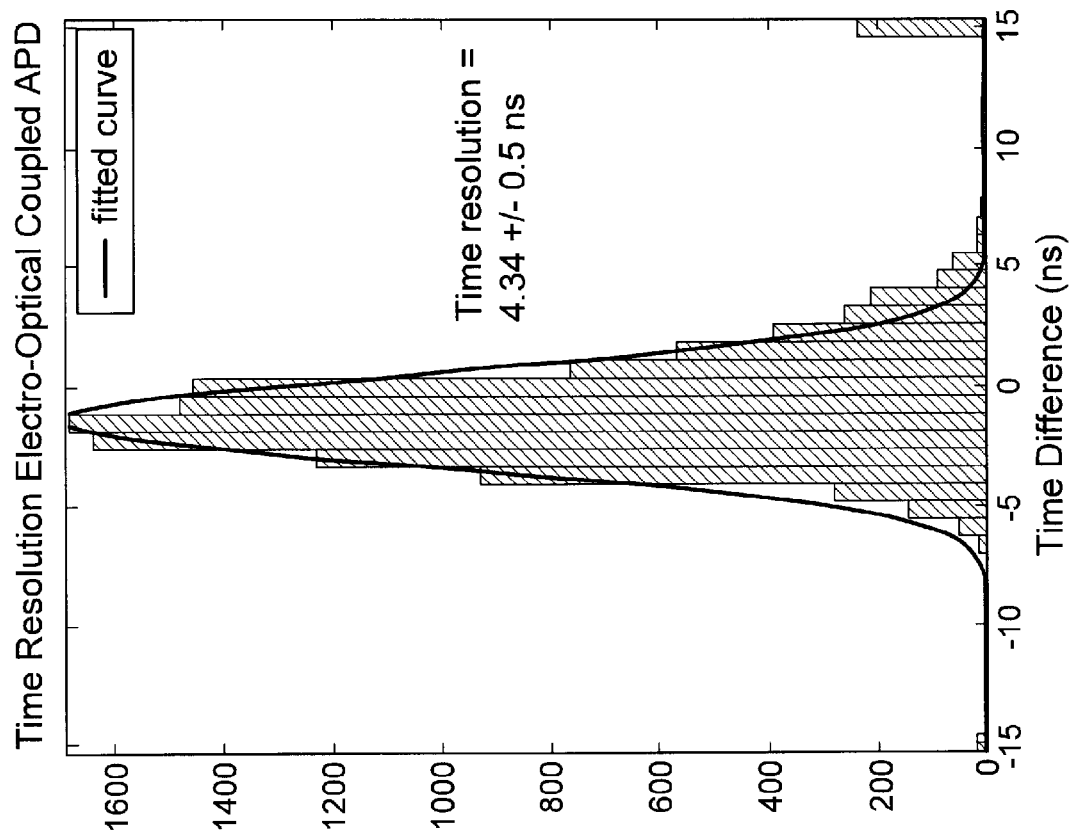

The electro-optical coupling degraded the PMT-APD coincidence time resolution from 3.2+/−0.2 ns (FIG. 12A) to 4.3+/−0.5 ns (FIG. 12B). The time resolution is very good considering that the signal in this experimental setup was coupled over 5 meters of cable.

Results indicate that the example electro-optical coupling setup preserves high SNR of the PET data. Electro-optical coupling successfully relayed analog scintillation signals over a significant optical fiber length (e.g., 5 meters). The SNR may be further improved, for example, by optimizing the VCSEL operating parameters (DC bias current), laser driver, and photodiode receiver to reduce noise of the electro-optical coupling.

An example PET detector and readout assembly according to embodiments of the present invention can operate in a high field MRI system with insignificant degradation in either the PET system performance or the MRI system performance. The signal is amplified before optical fiber transmission, and long optical light guides are not needed between a scintillation crystal and photodetector. By coupling the scintillation pulses over fiber, a significant challenge in development of large field PET/MR designs may be completely avoided; i.e., how to couple the hundreds of shielded coax signals out of the MR bore without significantly degrading MR and PET performance. Hundreds to thousands of electrical signal wires can be eliminated from PET detectors inside of an MRI magnet to readout electronics. Electro-coupling over fibers also has significant SNR advantages over, for example, simply directing the scintillation light to an optical fiber.

The MRI detection can be standard, and can be completely independent of PET operation. It can run at the same time as the PET operation, or separately, without interference from the PET system, or vice versa.

Example applications of the invention include methods, apparatus, and systems for imaging using positron emission tomography (PET) in combination with magnetic-based imaging methods. Nonlimiting example applications of imaging methods and systems include MR-compatible PET detectors and nuclear scintillation detectors operating in harsh environments that need to relay signals over long distances.

In addition to PET, alternative imaging methods and systems including high-energy photon detectors can be used with example embodiments of the present invention. X-ray, X-ray computed tomography, gamma ray planar imaging, and single photon emission computed tomography (SPECT) are nonlimiting examples of alternative imaging methods and systems that may be used.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the invention are set forth in the appended claims.

What is claimed is:

1. A front end for an imaging system comprising:
  a magnetically-insensitive high energy photon detector configured to receive emitted photons and produce an output; and
  an interface coupled to said high energy photon detector configured to convert an output of said high energy photon detector to an optical signal and transmit said optical signal;
  wherein said interface comprises:
  an amplifier coupled to said high energy photon detector and configured to convert the output of the high energy photon detector to a voltage;
  a driver coupled to said amplifier and configured to receive the voltage and drive a laser diode.

2. The front end of claim 1, wherein said driver comprises a laser driver; and
  wherein said interface further comprises a laser diode coupled to said laser driver.

3. The front end of claim 1, wherein said amplifier comprises a charge sensitive preamplifier.

4. A front end for an imaging system comprising:
  a magnetically-insensitive high energy photon detector configured to receive emitted photons and produce an output; and
  an interface coupled to said high energy photon detector configured to convert an output of said high energy photon detector to an optical signal and transmit said optical signal;
  further comprising:
  a receiver configured to receive the transmitted optical signal and to convert the optical signal into a voltage signal; and
  an optical coupler, said optical coupler being coupled to said interface and to said receiver for coupling the transmitted optical signal to the receiver;
  wherein said optical coupler comprises optical fiber; and
  wherein said interface comprises a laser diode coupled to said optical fiber for transmitting the optical signal.

5. A front end module for an imaging system, comprising:
  at least one magnetically-insensitive high-energy photon detector located in a high magnetic field environment;
  an interface configured to convert an output of said at least one high-energy photon detector to an optical signal and to transmit the optical signal, the interface being located in the high magnetic field environment; and
  a receiver optically coupled to said interface configured to receive the optical signal and to convert the optical signal into a voltage signal, the receiver being located outside of the high magnetic field environment.

6. The front end module of claim 5, wherein the high magnetic field environment comprises an MRI system, and wherein said receiver is disposed outside of the MRI system.

7. The front end module of claim 5, wherein said at least one high energy photon detector comprises:
  at least one scintillation crystal configured to receive emitted photons and produce a signal; and
  at least one photodiode configured to receive the produced signal and produce the output.

8. The front end module of claim 5, wherein said interface is magnetically insensitive.

9. The front end module of claim 5, further comprising:
  an optical coupler configured to optically couple said interface and said receiver.

10. The front end module of claim 9, wherein said optical coupler comprises at least one optical fiber.

11. A PET system comprising:
  the front end module of claim 5; and
  electronics configured to convert the voltage from said receiver and generate an image from the voltage.

12. An imaging system comprising:
  the PET system of claim 11; and
  an MRI system.

13. A front end module for an imaging system, comprising:
  at least one magnetically-insensitive high-energy photon detector located in a high magnetic field environment;
  an interface configured to convert an output of said at least one high-energy photon detector to an optical signal and to transmit the optical signal, the interface being located in the high magnetic field environment; and
  a receiver optically coupled to said interface configured to receive the optical signal and to convert the optical signal into a voltage signal, the receiver being located outside of the high magnetic field environment;
  wherein said interface comprises an amplifier and a laser diode.

14. A front end module for an imaging system, comprising:
  at least one magnetically-insensitive high-energy photon detector located in a high magnetic field environment;
  an interface configured to convert an output of said at least one high-energy photon detector to an optical signal and to transmit the optical signal, the interface being located in the high magnetic field environment; and
  a receiver optically coupled to said interface configured to receive the optical signal and to convert the optical signal into a voltage signal, the receiver being located outside of the high magnetic field environment;

wherein said interface comprises:
a charge sensitive preamplifier configured to convert the output of said at least one high-energy photon detector to a voltage;
a laser driver configured to convert the voltage to a current; and
a laser diode configured to receive the current and generate the optical signal.

\* \* \* \* \*